(12) United States Patent
Pothireddy et al.

(10) Patent No.: US 7,518,535 B1
(45) Date of Patent: Apr. 14, 2009

(54) GENERATING A GRAY CODE SEQUENCE FOR ANY EVEN LENGTH USING AN INTERMEDIATE BINARY SEQUENCE

(75) Inventors: Anil Pothireddy, Andra Pradesh (IN); Jayashri Arsikere Basappa, Karnataka (IN); David Grant Wheeler, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/954,451

(22) Filed: Dec. 12, 2007

(51) Int. Cl.
*H03M 7/04* (2006.01)
(52) U.S. Cl. .......................................... 341/98; 341/96
(58) Field of Classification Search ............ 341/96–98
See application file for complete search history.

(56) References Cited

U.S. PATENT DOCUMENTS

| | | | |
|---|---|---|---|
| 6,073,950 A * | 6/2000 | Busby | 280/284 |
| 6,314,154 B1 | 11/2001 | Pontius | |
| 6,703,950 B2 | 3/2004 | Yi | |
| 6,742,126 B1 * | 5/2004 | Mann et al. | 726/5 |
| 6,762,701 B2 | 7/2004 | Jiang | |
| 6,801,143 B2 | 10/2004 | Oberai et al. | |
| 7,071,855 B1 * | 7/2006 | Sadowsky | 341/98 |

* cited by examiner

Primary Examiner—Lam T Mai
(74) Attorney, Agent, or Firm—Scott Charles Richardson; Eric W B Dias

(57) ABSTRACT

Generating Gray sequences for non-standard sequence lengths to be used in cyclical sequences having L members. For binary members of the cyclical sequence having values less than L/2 an amount (C/2−L) the most significant bit is forced to a logical "1" to create intermediate binary members. For members greater than or equal to an amount (C/2−L) is added to the binary to create intermediate binaries. The intermediate binaries are then transformed to a Gray code sequence having a non-standard sequence length of L.

17 Claims, 5 Drawing Sheets

GENERATING A GRAY CODE SEQUENCE FOR ANY EVEN LENGTH USING AN INTERMEDIATE BINARY SEQUENCE

BACKGROUND

1. Field

The present invention relates to the generation of data sequences for the storage and transmission of data, and more specifically, to systems, methods and computer products for generating Gray sequences for non-standard sequence lengths.

2. Description of Related Art

The key characteristic of Gray code sequence is that there is only a one bit difference between any two consecutive numbers in a sequence, while more than one bit may differ in a normal binary sequence. Non-Gray code binary sequences with more than one bit differences from one number to the next can cause problems in circuits that are noise sensitive or those involving multiple clock domain frequencies. Gray codes where only one bit differs at a time while counting a sequence tend to improve the performance in these scenarios. However, Gray codes have a requirement that the length of the sequence should be a power of two in order to be used in a cyclic fashion. As such, conventional Gray codes exist only for cyclical sequences of four numbers, of eight numbers, of sixteen numbers, of thirty-two numbers, etc. But for sequence lengths that are not a power of two, cyclic Gray code cannot be used without compromising the characteristic of Gray code to have only 1-bit difference at a time. So, there is a need for generating a cyclic Gray code that can count lengths that are not a power of 2.

SUMMARY

Embodiments disclosed herein address the above stated needs by providing systems, methods and computer products for generating a new Gray code for a cyclic sequence. In response to determining that a number of elements in the cyclic sequence is not equal to a power of two (but of even length) or otherwise detecting a transition that changes more than one bit, an intermediate Gray code is generated. From the intermediate Gray code a new Gray code is then generated having a transition of no greater than one bit.

Various embodiments may convert a set of binary numbers in a cyclical sequence having L members of n bits each to Gray code by determining whether the binary number is greater than or equal to L/2, or is less than L/2. If the binary number is determined to be greater than or equal to L/2 the most significant bit of the binary number is set to a logical "1" to convert the binary number to an intermediate binary. However, if the binary number is determined to be less than L/2 adding (2n/2−L) to the binary number to convert the binary number to the intermediate binary. The intermediate binaries of the cyclical sequence may then be converted to Gray code in which no two consecutive members of the Gray code for the cyclical sequence have a transition of more than one bit.

BRIEF DESCRIPTION OF THE DRAWINGS

The accompanying drawings, which are incorporated in and constitute part of the specification, illustrate various embodiments of the invention. Together with the general description, the drawings serve to explain the principles of the invention. In the drawings.

DETAILED DESCRIPTION

Figure 1A:
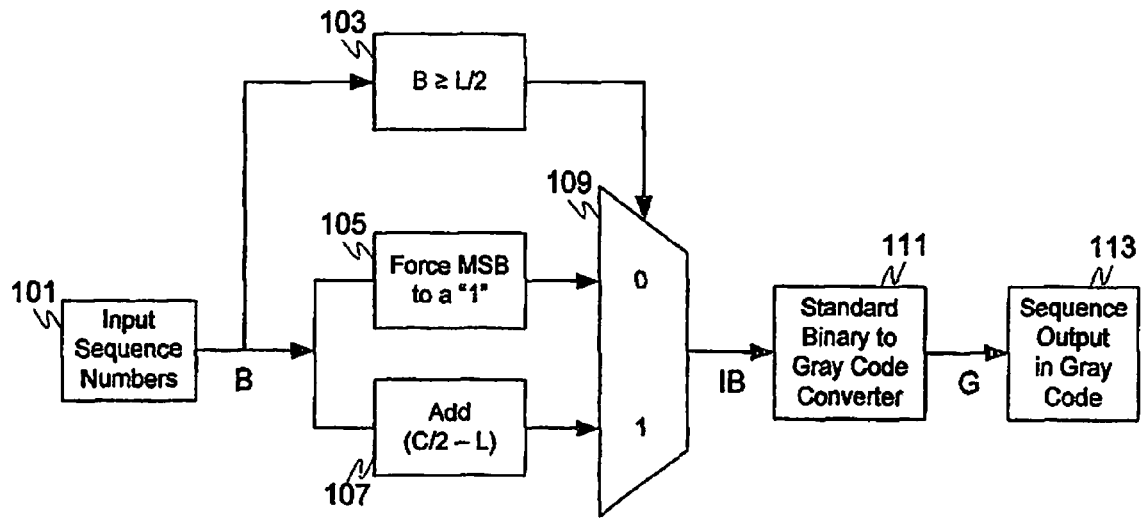
FIG. 1A depicts logic of an exemplary digital circuit suitable for generating an intermediate-binary sequence for converting nonconventional sequence lengths to Gray code.

The various embodiments involve methods for generating cyclic Gray codes for all even lengths. The methods involve generating an intermediate binary sequence which, when translated to a Gray code sequence, can be used for lengths that are not power of 2, and still maintain the Gray code characteristic of 1-bit change at a time. For example in a digital system that involves two clock domains, the first clock domain converts the binary sequence to Gray code sequence and transmits the Gray code to the second clock domain. This is a relatively safe transfer mechanism as only one bit changes and the chance of metastability occurring is greatly reduced. (It should be noted that standard asynchronous transfer procedures should still be followed.) The second domain then converts the received Gray code signal back to the binary sequence.

The various embodiments disclosed herein use an intermediate binary sequence, which is transparent to the logic that generates or uses the actual binary numbers. Only the binary-to-Gray and Gray-to-binary converters have to be modified to incorporate the intermediate binary numbers, thus assuring the remaining logic of the digital system is unaffected. An intermediate-binary code is generated by manipulating the original decimal-binary sequence such that the intermediate-binary sequence when converted to Gray-code by standard techniques will only have one-bit difference between consecutive numbers.

TABLE 1

Binary and corresponding Gray codes for 4 bit numbers.

| Binary Code | Gray Code |
|---|---|
| 0000 | 0000 |
| 0001 | 0001 |
| 0010 | 0011 |
| 0011 | 0010 |
| 0100 | 0110 |
| 0101 | 0111 |
| 0110 | 0101 |
| 0111 | 0100 |
| 1000 | 1100 |
| 1001 | 1101 |
| 1010 | 1111 |
| 1011 | 1110 |
| 1100 | 1010 |
| 1101 | 1011 |
| 1110 | 1001 |
| 1111 | 1000 |

Table 1 lists 16 4-bit numbers and their corresponding Gray codes. If a sequence length is four, the order of Gray codes would be: 0000, 0001, 0011, 0010, then back to 0000, 0001, etc. This conforms to the Gray code requirement that only one bit changes at a time. However, for a sequence length of five—a nonconforming Gray code sequence length—the order of Gray codes would be: 0000, 0001, 0011, 0010, 0110, then back to 0000. This does not conform to the Gray code requirement that only one bit changes at a time since two bits change between 0110 and 0000 when beginning the sequence cycle again. This holds true for all nonconforming Gray code sequence lengths, that is, for all sequence lengths that are not a power of two (e.g., 2, 4, 8, 16, etc.). Take for example, a cyclical sequence having ten members (0 through 9). Only one bit in the Gray code changes when counting from 0 to 9. But when rolled back (i.e., the transition from 9 to 0) there is a 3-bit change (1101 to 0000). This is reflected in Table 2 below, comparing the last number in the sequence, 1101, to the first number in the sequence, 0000.

TABLE 2

Binary and Gray sequence for a length of 10

| Binary Code | Gray Code |
| --- | --- |
| 0000 | 0000 |
| 0001 | 0001 |
| 0010 | 0011 |
| 0011 | 0010 |
| 0100 | 0110 |
| 0101 | 0111 |
| 0110 | 0101 |
| 0111 | 0100 |
| 1000 | 1100 |
| 1001 | 1101 |

FIG. 1A depicts logic of an exemplary digital circuit suitable for generating an intermediate-binary sequence to overcome the problem of transitioning from the end of a sequence back to the beginning. The blocks of FIGS. 1A-1B, which are referred to as "logic" herein, may be implemented as hardware in the form of digital circuitry, analog circuitry, or a combination of these. Further, the various blocks of FIGS. 1A-1B may be implemented as either hardware or software, or a combination of the two. The digital logic circuit of FIG. 1A exhibits a technique for converting binary to intermediate binary, where the variables are defined as follows:

B—Binary sequence that has to be converted to Gray code.
  B(i) is the ith binary number in the sequence.
L—Length of the sequence (need not be a power-of-two).
  L is preferably an even number.
C—Max count possible; i.e., $2^n$ (where n is the number of bits in the binary code).
IB—Intermediate Binary Sequence (output from block 109).
G—Gray code.
MSB—Most Significant bit (left most bit).

In the example using the ten number sequence of Table 2 the variables are defined as: n=4, C=16, L=10, L/2=5, (C/2−L)=−2. In the circuit of FIG. 1A, if the block 103 outputs a logical "1" (true), then block 109 passes the result from 107. If the block 103 output is a "0" then block 109 passes the result from 105. The block 103 determines whether the sequence number being considered is greater than or equal to L/2, or whether the sequence number is less than L/2. If the sequence number is less than L/2, then the most significant bit (MSB) in the sequence number is forced to a logical "1" in accordance with block 105. For example, in Table 3, L=10. (There are ten members of the cyclical sequence set.) The sequence number B(5)=4 (0100) is less than L/2, so its MSB is forced to a logical "1", thus making the intermediate binary=1100. The next sequence number, however, B(6)=5 (0101) is >L/2, so C/2−L is added (that is, −2 is added), thus making the intermediate binary=0011.

TABLE 3

Summarizes the encode conversions for a length of 10.

| Binary (B) | Intermediate Binary (IB) | Gray Code (G) |
| --- | --- | --- |
| 0000 | 1000 | 1100 |
| 0001 | 1001 | 1101 |
| 0010 | 1010 | 1111 |
| 0011 | 1011 | 1110 |
| 0100 | 1100 | 1010 |
| 0101 | 0011 | 0010 |
| 0110 | 0100 | 0110 |
| 0111 | 0101 | 0111 |
| 1000 | 0110 | 0101 |
| 1001 | 0111 | 0100 |

Once all the numbers in the sequence have been converted to intermediate binarys (IBs), a Gray code converter can be used to output a cyclical Gray code sequence that does not vary more than 1-bit from one number in the sequence to the next, or when resetting the sequence (i.e., from 0100 back to 0000, as shown in Table 3). In the digital circuit of FIG. 1A, block 111 contains a binary to Gray code converter. For converting Intermediate Binary to Gray code, any standard binary to Gray code conversion techniques can be adopted. The Gray-Code sequence generated in this way has only one-bit difference between any consecutive numbers and also when it is rolled over (0100 to 1100).

When this technique is used to transfer a sequence (say, a FIFO read/write address) across the clock domains, the first domain will have the above logic to generate the intermediate binary sequence and then convert the intermediate binary sequence to the Gray code. The Gray code generated this way would be transmitted to the second domain. The second domain should have a modified decoder to decode the received Gray code sequence and be able to get the original binary sequence.

Figure 1B:
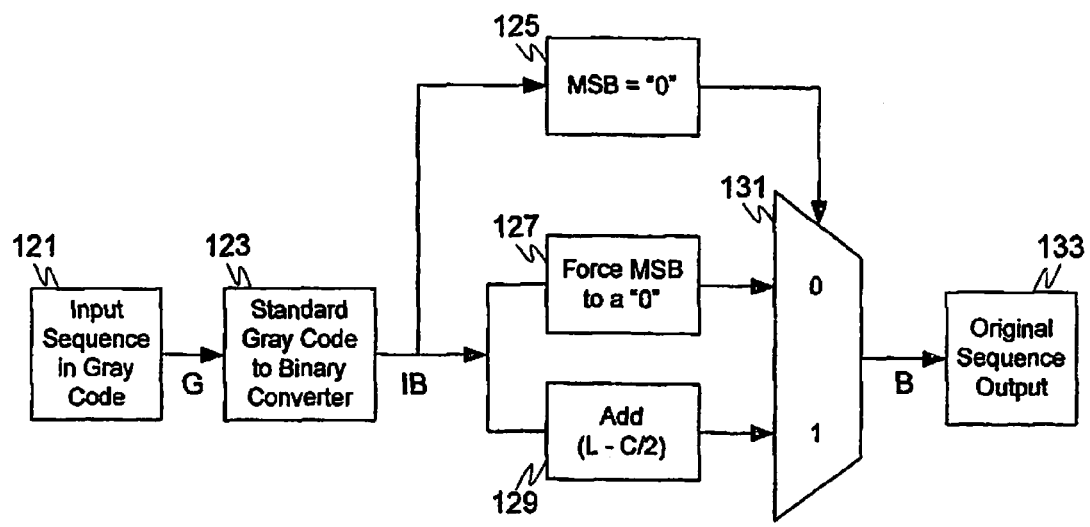
FIG. 1B depicts logic of an exemplary digital circuit suitable for converting nonconventional sequence length Gray codes back to their original binary sequence.

FIG. 1B depicts logic of an exemplary digital circuit suitable for converting nonconventional sequence length Gray codes (generated with the circuitry of FIG. 1A) back to their original binary sequence. The variables for the digital logic circuit depicted in FIG. 1B are similar to those of FIG. 1A, having the following values:

G—Gray code.
IB—Intermediate Binary Sequence (output from 123).
B—Binary sequence recovered from Gray code.
L—Length of the sequence (need not be a power of two). Is preferably an even number.
C—Max count possible; i.e., $2^n$ (where n is the number of bits in the binary code).
MSB—Most Significant bit (left most bit)
In this example n=4, C=16, L=10, L/2=5, and (L−C/2)=2.

TABLE 4

Summarizes the decode conversions for a length of 10

| Gray Code (G) | Intermediate Binary (IB) | Binary (B) |
| --- | --- | --- |
| 1100 | 1000 | 0000 |
| 1101 | 1001 | 0001 |
| 1111 | 1010 | 0010 |
| 1110 | 1011 | 0011 |
| 1010 | 1100 | 0100 |

TABLE 4-continued

Summarizes the decode conversions for a length of 10

| Gray Code (G) | Intermediate Binary (IB) | Binary (B) |
|---|---|---|
| 0010 | 0011 | 0101 |
| 0110 | 0100 | 0110 |
| 0111 | 0101 | 0111 |
| 0101 | 0110 | 1000 |
| 0100 | 0111 | 1001 |

Table 4 shows the Gray code input (G) of block 121 to the digital circuit in FIG. 1B, and the corresponding binary output (B) at block 133. From Table 4 it can be seen that the original binary sequence is recovered and also the Gray code sequence differs by only 1-bit between and successive numbers. In the digital circuit of FIG. 1B, block 123 contains a Gray code to binary converter. Any standard Gray-to-binary decoder can be used in the second domain to get back a binary sequence from the Gray code. Since an intermediate binary sequence was used in the first domain, the second domain gets the intermediate binary sequence when a standard Gray-to-binary decoder is used. If block 125 is a logical "1" (true) then block 129 is performed. That is, if the Gray code number from 121 being converted has a most significant bit of "0" then block 129 is performed. Otherwise, block 127 is performed.

The various embodiments disclosed herein help to provide improved error correction and flexibility in the choice of sequence length. As for improved error correction, when counting smaller sequences in a sequential order the bits towards MSB (left most bit) are constant for extended periods. When using the Intermediate-Binary numbers, we notice a more random distribution of '0's and '1's. As for flexibility in choosing the range of numbers, when the length of the sequence is small enough, we have flexibility to choose a value for n, and hence C. For example, for this 4 bit counter (n=4) and C=16, should a case arise where the length needed is 6, (L=6), there is a flexibility to choose a value of 3 for n. (n=3, C=8). Having an option to pick more than one sequence of Gray codes for a smaller range on numbers will assist in achieving more robust systems which are fault tolerant.

Figure 2:
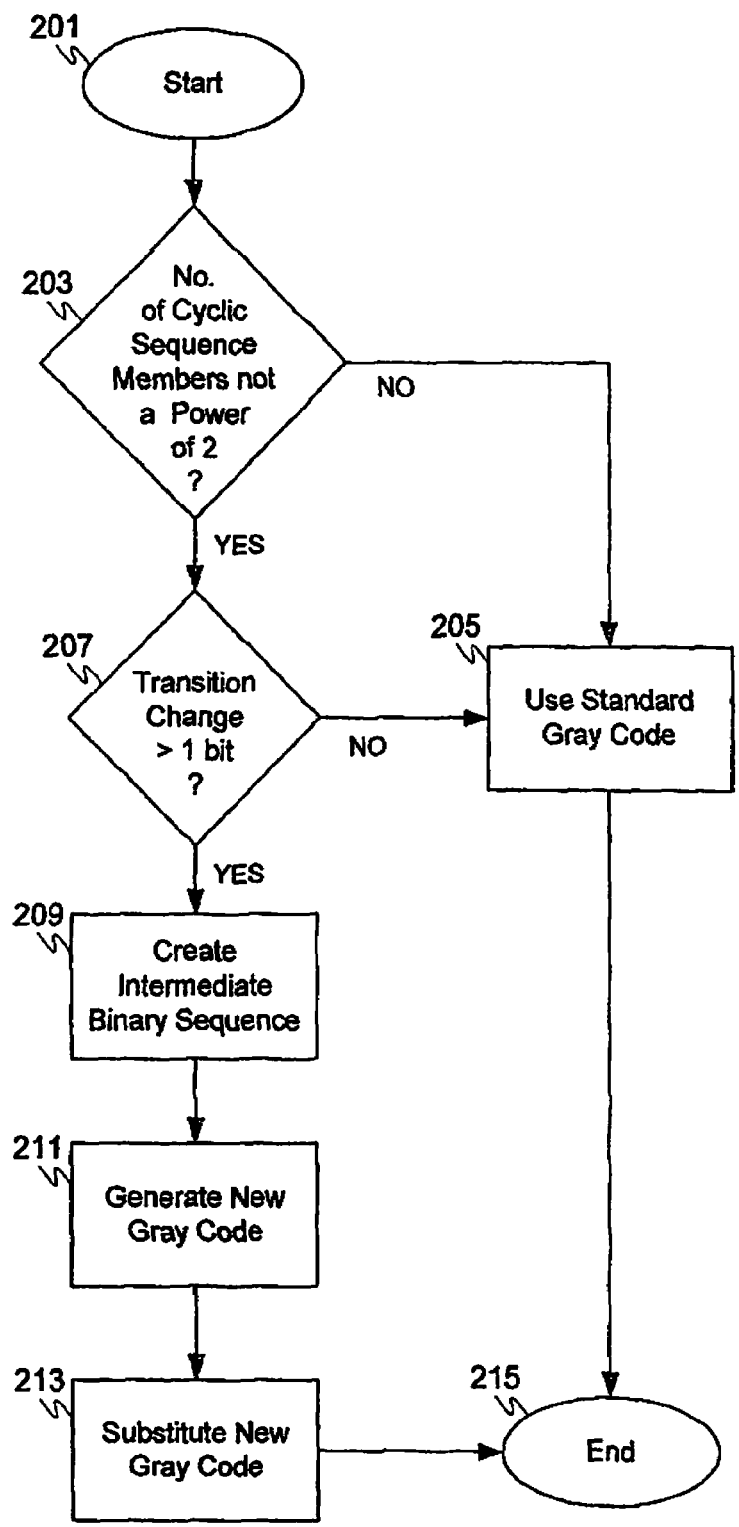
FIG. 2 is a flowchart depicting an overview of an exemplary method 200 for generating a new Gray code for a cyclic sequence according to various embodiments of the invention.

FIG. 2 is a flowchart depicting an overview of an exemplary method 200 for generating a new Gray code for a cyclic sequence according to various embodiments of the invention. The method begins at 201 and proceeds to 203 to determine whether or not the number of members in the cyclical sequence is a power of two (e.g., 4, 8, 16, 32, and so on). If the cyclical sequence contains a number of members equal to a power of two the method may proceed from 203 along the "NO" path to 205 and use standard Gray code. However, if it is determined in 203 that the number of members in the cyclical sequence is not a power of two and of even length, then the method proceeds from 203 along the "YES" path to 207.

Block 207 determines whether there is a transition of more than one bit in the cyclical sequence. Typically, this is not the case if the number of members in the cyclical sequence is equal to a power of two. However, if the cyclical sequence begins at a point other than 0, then there may be a transition of more than one bit even though the number of cyclical sequence members equals a power of two. If it is determined in 207 that there is not a transition change of more than 1 bit, then the method proceeds from 207 along the "NO" path to 205 to use standard Gray code. However, if it is determined in 207 that there is a transition change of more than 1 bit, the method proceeds from 207 along the "YES" path to 209 to begin the process of creating a Gray code in accordance with the various embodiments. In 209 the binary numbers of the cyclical sequence are converted to intermediate values. This may be done in accordance with the circuitry depicted in FIG. 1A and/or the method disclosed in conjunction with FIG. 3. Once the intermediate binary numbers have been created the method proceeds from 209 to 211 to convert them to Gray code. The method then proceeds to 213 to substitute the new Gray code values for the binary numbers in the sequence, and then the method ends in 215.

Figure 3:
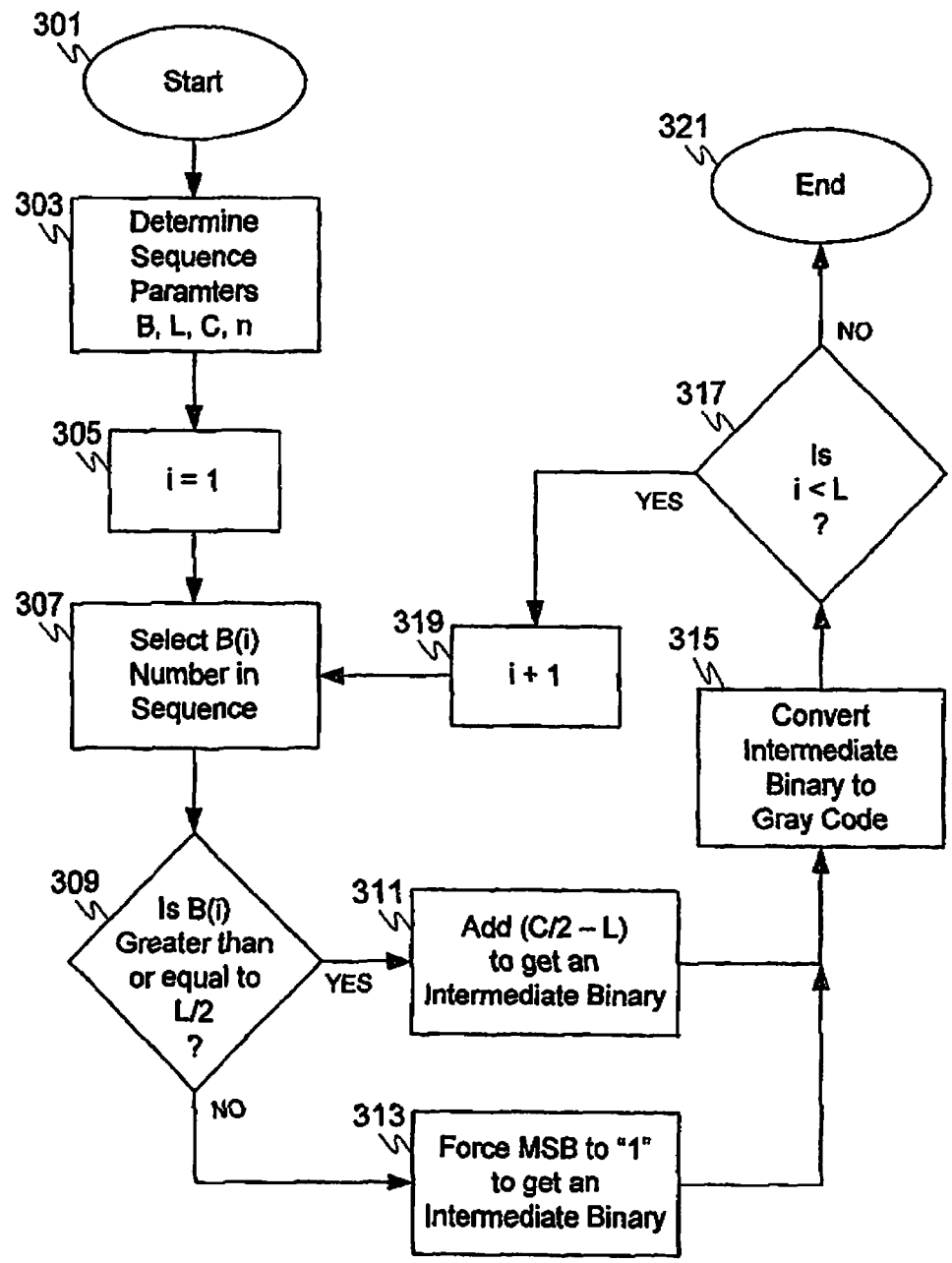
FIG. 3 is a flowchart depicting an exemplary method 300 for generating a new Gray code for a nonconventional length cyclic sequence according to various embodiments of the invention.

FIG. 3 is a flowchart depicting an exemplary method 300 for generating a new Gray code for a nonconventional length cyclic sequence according to various embodiments of the invention. The method begins in 301 and proceeds to 303 to determine the values of the variables that describe the cyclical sequence of numbers to be converted. The variable B represents the binary sequence to be converted to Gray code, and B(i) represents the $i^{th}$ member of the cyclical binary sequence. The variable L represents the length of the sequence—the number of members the cyclical sequence has before it resets to the first value. Although the sequences of any length L may be used, the various embodiments are especially advantageous for nonconventional sequence lengths—that is, cyclical sequences having a number of members that is not a power of two (e.g., not 4, 8, 16, 32, and so on). The length L is preferably an even number. The variable n is the number of bits in the binary. The variable C is the maximum count possible (i.e., the largest number possible in the cyclical sequence). The variable C may be expressed in terms of the variable n by the relationship: $C=2^n$. For example, if there are four bits in the binary numbers of the sequence (as in Table 3), then $C=2^4=16$. Once the variables have been determined in 303 the method proceeds to 305 to set i to 1 and begin the process of creating an intermediate binary.

Upon completing 305 the method then proceeds to 307 to select the $i^{th}$ binary number in the cyclical sequence, B(i). The method proceeds to 309 to determine whether B(i) is greater than or equal to L/2, or is less than L/2 (where L is the length of the cyclical sequence—the number of members in the sequence before it cycles back to the first value). If B(i) is greater than or equal to L/2 the method proceeds from 309 along the "YES" path to 311. In block 311 the quantity (C/2−L) is added to the B(i) binary number being converted to produce an intermediate binary, and then the method proceeds to 315. However, back in 309 if it is determined that B(i) is less than L/2 then the method proceeds from 309 along the "NO" path to 313. In 313 the most significant bit (MSB) is set to a logical "1", to produce an intermediate binary (e.g., the center column in Table 3). The method then proceeds to 315.

In block 315 the intermediate binary is converted to Gray code. A standard Gray code converter may be used for this. Once B(i) is converted to a Gray code binary the method proceeds to 317 to determine whether there are any more numbers in the cyclical sequence B to be converted. If i has not yet incremented to the sequence length L the method proceeds from 317 along the "YES" path to 319. In block 319 the variable i is incremented by 1, and then the method proceeds to 307 to select the next binary in the sequence, B(i). However, back in 317 if it is determined that i=L and all the binary numbers in the cyclical sequence have been converted, the method proceeds from 317 along the "NO" path to 321 and ends.

Figure 4:
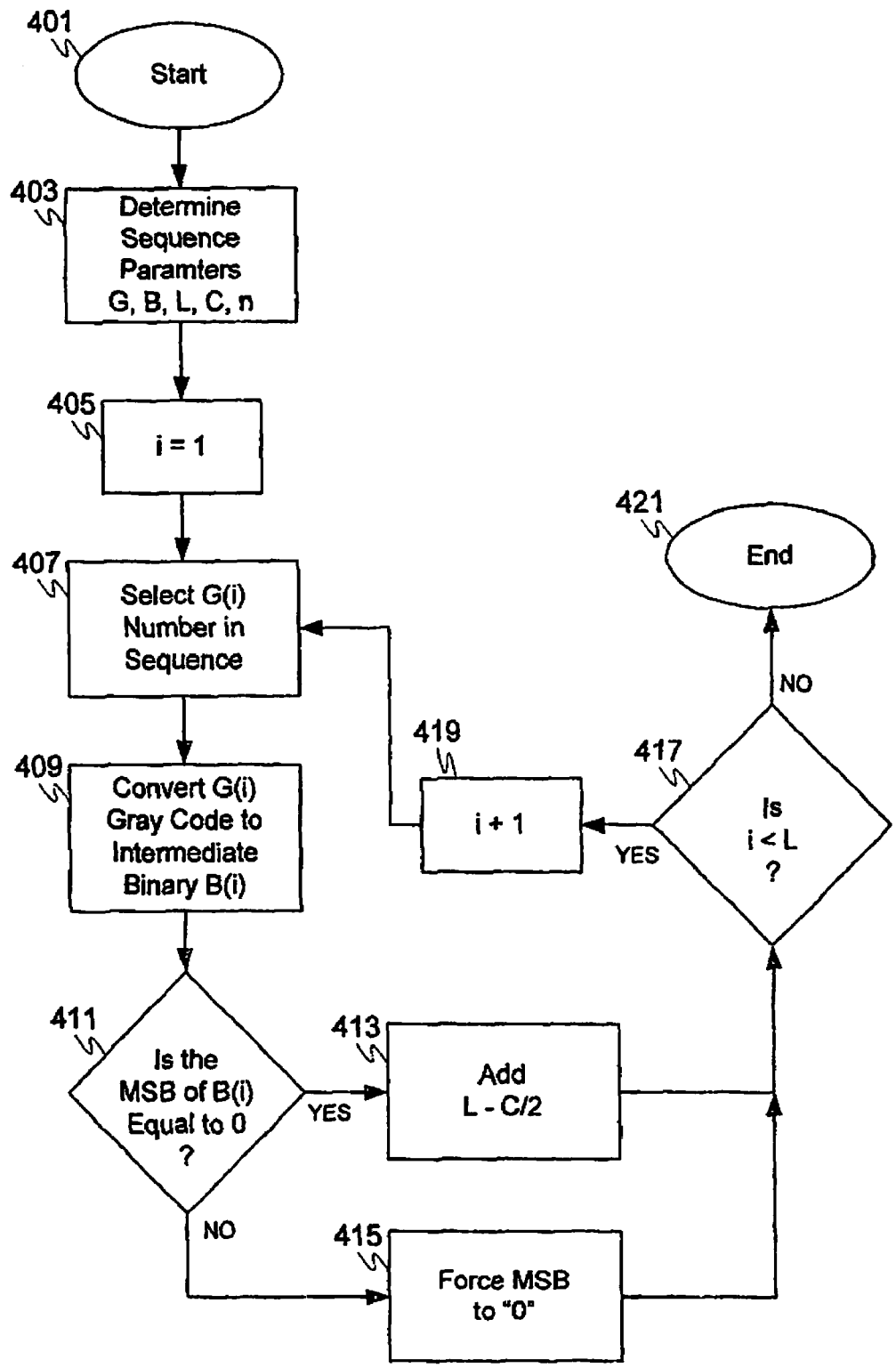
FIG. 4 is a flowchart depicting an exemplary method 400 for converting the Gray code generated in FIG. 3 back to its original binary value according to various embodiments of the invention.

FIG. 4 is a flowchart depicting an exemplary method 400 for converting the Gray code generated in accordance with various embodiments of the invention back to its original binary value. The method begins in 401 and proceeds to 403 to determine the values of the variables that describe the cyclical sequence of numbers to be converted. The variable G represents the Gray code sequence to be converted back to back to their original binary values. G(i) represents the $i^{th}$ member of the cyclical Gray code sequence, and B(i) represents the $i^{th}$ member of the cyclical binary sequence corresponding to G(i). The variable L represents the length of the sequence—that is, the number of Gray code variables in the cyclical sequence that are to be converted back to their original binary values. The variable C is the maximum count possible, i.e., the largest number possible in the cyclical sequence. The variable n is the number of bits in the binary. The variable C can be expressed in terms of n by: $C=2^n$. Once the variables have been determined in 403 the method proceeds to 405 to set i to 1 and begin the process of converting the Gray code back to their original binary values.

In 407 the G(i) Gray code number of the sequence is selected. The method then proceeds to 409 to convert the Gray code binary into an intermediate code binary. A standard Gray code to binary converter may be used for this. Once the G(i) member of the cyclical sequence has been converted to B(i), the method proceeds from 409 to 411. In 411 it is determined whether the most significant bit (MSB) of B(i) is equal to logical "0". If the B(i) MSB is equal to logical "0" the method proceeds from 411 along the "YES" path to 413. In block 413 the quantity (L−C/2) is added to the intermediate binary B(i) to restore it to its original binary value. The method then proceeds to 417. However, back in block 411, if it is determined that the most significant bit of B(i) is not equal to logical "0" the method proceeds from 411 to 415 to force the most significant bit to "0". The method then proceeds to 417.

In 417 it is determined whether or not all of the Gray values of the cyclical sequence have been converted back to their original value. If i is less than L, there are more values to be converted back, and the method proceeds from 417 along the "YES" path to 419 to increment i by 1. The method then proceeds from 419 back to 407 to select the next G(i) variable for conversion. However, back in 417 if it is determined that all of the G(i) binary numbers in the sequence have been processed, then the method proceeds from 417 along the "NO" path to 421 and ends.

Figure 5:
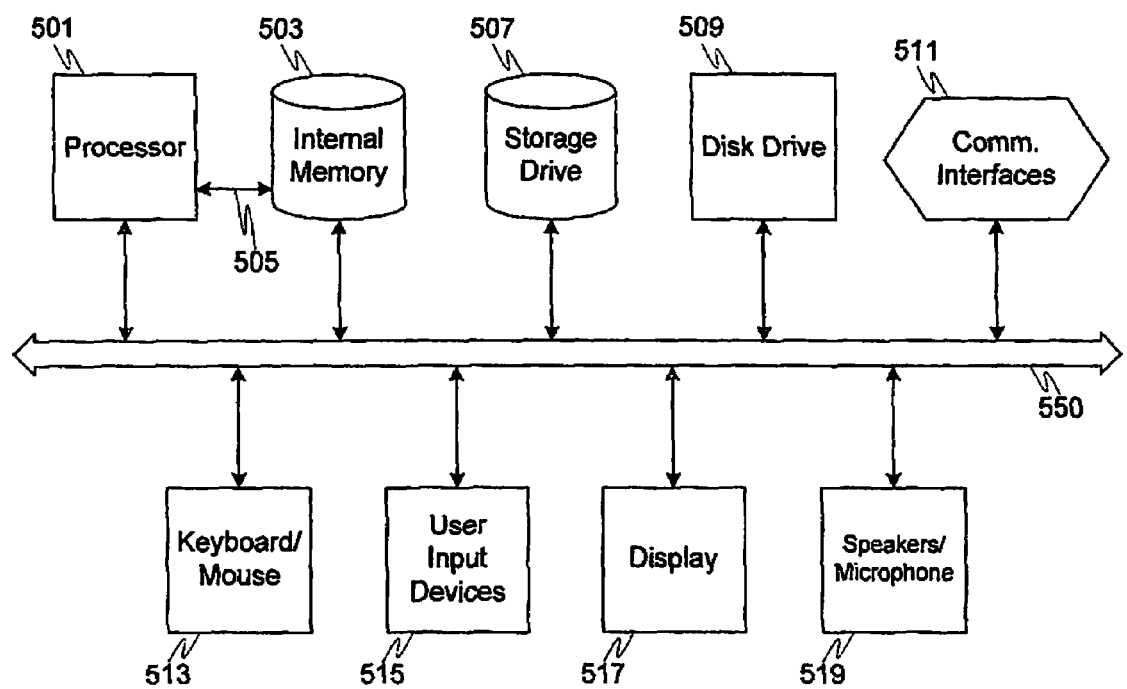
FIG. 5 depicts an exemplary computer system 500 suitable for implementing and practicing various exemplary embodiments.

FIG. 5 depicts an exemplary computer system 500 that may be used to implement various embodiments of the invention. The computer system 500 includes a processor 501 which may be embodied as a microprocessor or central processing unit (CPU). The processor 501 is typically configured to access an internal memory 503 via a bus such as the system bus 550. The internal memory 503 may include one or more of random access memory (RAM), read-only memory (ROM), cache memory, or a combination of these or other such circuitry configured to store information in a retrievable format. In some implementations the internal memory 503 may be configured as part of the processor 501, or separate from it but within the same packaging. The processor 501 may be able to access internal memory 503 via a different bus, or via control lines (e.g., local bus 505) than it uses access the other components of computer system 500.

The computer system 500 also typically includes, or has access to, one or more storage drives 507 and floppy disk drives 509. The storage drive 507 is often a hard disk drive configured for the storage and retrieval of data, computer programs or other information. The floppy disk drives 509 may include a combination of several disc drives of various formats that can read and/or write to removable machine readable medium. The machine readable medium may be any of the various available storage formats, including, for example, CD-R, CD-RW, DVD, DVD-R, floppy disk, or the like. The computer system 500 may either include the storage drives 507 and floppy disk drives 509 as part of its architecture (e.g., within the same cabinet or enclosure), as connected peripherals, or may access the storage drives 507 and floppy disk drives 509 over a network, or a combination of these. The storage drive 507 is often used to store the software, instructions and programs executed by the computer system 500.

The computer system 500 may include communication interfaces 511 configured to be communicatively connected to the Internet, a local area network (LAN), a wide area network (WAN), or connect with other devices using protocols such as the Universal Serial Bus (USB), the High Performance Serial Bus IEEE-1394 and/or the high speed serial port (RS-232). The components of computer system 500 may be interconnected by a bus 550 and/or may include expansion slots conforming to any of various industry standards such as PCI (Peripheral Component Interconnect), ISA (Industry Standard Architecture), or EISA (enhanced ISA).

Typically, the computer system 500 includes one or more user input/output devices such as a keyboard and/or mouse 513, or other means of controlling the cursor (e.g., touchscreen, touchpad, joystick, trackball, etc.) represented by the user input devices 515. A display 517 is also generally included as part of the computer system 500. The display may be any of several types of displays, including a liquid crystal display (LCD), a cathode ray tube (CRT) monitor, a thin film transistor (TFT) array, or other type of display suitable for displaying information for the user. The display 517 may include one or more light emitting diode (LED) indicator lights, or other such display devices. In addition, most computer systems 500 also include, or are connected to, one or more speakers and microphones 519 for audio output and input. Speech recognition software may be used in conjunction with the microphones 519 to receive and interpret user speech commands.

In regards to the methods disclosed herein for practicing the various embodiments, many of the specified activities and steps may be included, or excluded, or performed in a different order than described above, with the rest of the activities still remaining within the scope of at least one exemplary embodiment.

The invention may be implemented with any sort of processing units, processors and controllers (e.g., processor 501 of FIG. 5) capable of executing a program of instructions for performing the stated functions and activities. For example, the processor 501 may be embodied as a microprocessor, microcontroller, DSP, RISC processor, or any other type of processor that one of ordinary skill would recognize as being capable of performing the functions described herein. A processing unit in accordance with at least one exemplary embodiment can operate computer software programs stored (embodied) on computer-readable medium such as the internal memory 503 or storage drive 507, e.g. hard disk, CD, flash memory, ram, or other machine readable medium as recognized by one of ordinary skill in the art. The computer software or other programs of instructions can aid or perform the steps and activities described above. For example computer programs in accordance with at least one exemplary embodiment may include: source code for determining whether the binary number is greater than or equal to L/2, or is less than L/2; source code for setting the most significant bit of the binary number to a logical "1" to convert the binary number to an intermediate binary if the binary number is determined to be greater than or equal to L/2; source code for adding (2n/2—L) to the binary number to convert the binary number to the intermediate binary if the binary number is determined to be less than L/2; source code for converting the intermediate binary to Gray code; and source code for performing the any of the various activities of the exemplary embodiments disclosed herein. There are many further source codes that may be written to perform the stated steps and procedures above, and these are intended to lie within the scope of exemplary embodiments.

The use of the word "exemplary" in this disclosure is intended to mean that the embodiment or element so described serves as an example, instance, or illustration, and is not necessarily to be construed as preferred or advantageous over other embodiments or elements. The description of the various exemplary embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the spirit and scope of the present invention.

What is claimed is:

1. A method of converting a binary number to Gray code, the binary number being part of a set of binary numbers having L members each having n bits, the method comprising:
    determining whether the binary number is greater than or equal to L/2, or is less than L/2;
    setting the most significant bit of the binary number to a logical "1" to convert the binary number to an intermediate binary if the binary number is determined to be greater than or equal to L/2;
    adding ($2^n/2-L$) to the binary number to convert the binary number to the intermediate binary if the binary number is determined to be less than L/2; and
    converting the intermediate binary to Gray code.

2. The method of claim 1, wherein $2^n$=C which is the largest possible value of the binary number constrained by having said n number of bits.

3. The method of claim 1, wherein the binary number is part of a cyclical sequence having a nonconventional length of the number L.

4. The method of claim 3, wherein L is an even number not equal to a power of 2.

5. The method of claim 3, wherein no two consecutive members of Gray code for the cyclical sequence have a transition of more than one bit.

6. The method of claim 5, wherein a last member of the Gray code for the cyclical sequence and a first member of the Gray code for the cyclical sequence have a transition of one bit.

7. The method of claim 3, wherein said nonconventional length of the number L is a number other than a power of two.

8. The method of claim 1, wherein a standard Gray code converter is used to convert the intermediate binary to Gray code.

9. A software product comprising a machine readable medium including a program of instructions for converting a binary number to Gray code, the binary number being part of a set of binary numbers having L members each having n bits, wherein the program of instructions upon being executed on a computer causes the computer to perform activities comprising:
    determining whether the binary number is greater than or equal to L/2, or is less than L/2;
    setting the most significant bit of the binary number to a logical "1" to convert the binary number to an intermediate binary if the binary number is determined to be greater than or equal to L/2;
    adding ($2^n/2-L$) to the binary number to convert the binary number to the intermediate binary if the binary number is determined to be less than L/2; and
    converting the intermediate binary to Gray code.

10. The software product of claim 9, wherein $2^n$=C which is the largest possible value of the binary number constrained by having said n number of bits.

11. The software product of claim 10, wherein the binary number is part of a cyclical sequence having a nonconventional length of the number L.

12. The software product of claim 11, wherein L is an even number not equal to a power of 2.

13. The software product of claim 11, wherein no two consecutive members of Gray code for the cyclical sequence have a transition of more than one bit.

14. The software product of claim 13, wherein a last member of the Gray code for the cyclical sequence and a first member of the Gray code for the cyclical sequence have a transition of one bit.

15. The software product of claim 11, wherein said nonconventional length of the number L is a number other than a power of two.

16. The software product of claim 9, wherein a standard Gray code converter is used to convert the intermediate binary to Gray code.

17. A system configured to convert a binary number to Gray code, the binary number being part of a set of binary numbers having L members each having n bits, the apparatus comprising:
    logic configured to determine whether the binary number is greater than or equal to L/2, or is less than L/2;
    logic configured to set the most significant bit of the binary number to a logical "1" to convert the binary number to an intermediate binary if the binary number is determined to be greater than or equal to L/2;
    logic configured to ad ($2^n/2-L$) to the binary number to convert the binary number to the intermediate binary if the binary number is determined to be less than L/2; and
    logic configured to convert the intermediate binary to Gray code.

* * * * *